US008717108B2

(12) United States Patent
Rosadiuk et al.

(10) Patent No.: US 8,717,108 B2
(45) Date of Patent: May 6, 2014

(54) RESONATOR DEVICE

(75) Inventors: Paul G. Rosadiuk, Gardena, CA (US);
Walid M. Al-Bondak, Los Angeles, CA (US); Bruce A. Igawa, Trabuco Canyon, CA (US); Bryce Smith, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 145 days.

(21) Appl. No.: 13/085,448

(22) Filed: Apr. 12, 2011

(65) Prior Publication Data

US 2012/0262253 A1    Oct. 18, 2012

(51) Int. Cl.
*H03B 1/00*    (2006.01)
*H03B 5/18*    (2006.01)
*H01P 3/06*    (2006.01)

(52) U.S. Cl.
USPC .............................. 331/68; 331/101; 333/206

(58) Field of Classification Search
USPC ................ 331/68, 69, 96, 101, 107 C, 116 R, 331/116 FE, 158, 187
See application file for complete search history.

(56) References Cited

U.S. PATENT DOCUMENTS

| | | | |
|---|---|---|---|
| 6,078,230 A * | 6/2000 | Matsumoto et al. | 333/202 |
| 6,731,180 B1 * | 5/2004 | Clark et al. | 331/176 |
| 6,859,118 B2 * | 2/2005 | Marquardt | 333/206 |
| 7,541,883 B2 * | 6/2009 | Knecht et al. | 331/101 |
| 2004/0178858 A1 | 9/2004 | Miyazaki et al. | |
| 2005/0189679 A1 * | 9/2005 | Kenison et al. | 264/272.11 |
| 2008/0290956 A1 | 11/2008 | Horie | |
| 2009/0230486 A1 | 9/2009 | Shimodaira | |

FOREIGN PATENT DOCUMENTS

| | | |
|---|---|---|
| CN | 101662259 A | 3/2010 |
| JP | 9284050 A | 10/1997 |
| JP | 2002232235 A | 8/2002 |
| WO | 2006/134780 A1 | 12/2006 |

OTHER PUBLICATIONS

Bolger, et al., "Conductive Epoxy Adhesives to Replace Solder", Surface Mount Technology, Feb. 1992, pp. 66-70.*
McDaniel, "Parallel Gap Welding Kovar Ribbons to Copper Conductor Printed Wiring Boards", NASA Technical Note, NASA TN D-6236, Mar. 1971.*
McCandlish, "Military and Medical Applications", Electronic Materials Handbook, vol. 1, ASM International, 1989, pp. 386-389.*
Licari, et al., "Hybrid Microcircuit Technology Handbook (2nd Edition)", William Andrew Publishing, 1998, ISBN: 978-0-8155-1423-7 Electronic ISBN: 978-0-8155-1798-6, pp. 11-14 and 224-261.*
Golio, et al., "The history and future of GaAs devices in commercial wireless products.", BroadBand Communications for the Internet Era Symposium digest, 2001 IEEE Emerging Technologies Symposium on. IEEE, 2001.*

(Continued)

*Primary Examiner* — Ryan Johnson
(74) *Attorney, Agent, or Firm* — Toler Law Group, PC

(57) ABSTRACT

A coaxial resonator device includes a substrate including a chip-and-wire circuit. A resonator is coupled to the substrate using a conductive epoxy. A system includes a resonator device. The resonator device includes a housing having one or more connectors, a resonator coupled to the housing a conductive epoxy, and a chip-and-wire circuit connecting the resonator to the one or more connectors.

20 Claims, 5 Drawing Sheets

(56) References Cited

OTHER PUBLICATIONS

Military & Aerospace Electronics, "Crystek Corp. introduces small coaxial resonator oscillator", Sep. 1, 2008, retrieved from www.militaryaerospace.com/articles/print/volume-19/issue-9/new-products/components/crystek-corp-introduces-small-coaxial-resonator-oscillator.html.*

Zakaria, et al., "Design of coaxial resonator filter with nonuniform dissipation." Microwave Symposium Digest, 2008 IEEE MTT-S International. IEEE, 2008.*

EE Times, "L-band coaxial resonator oscillators deliver low phase noise for satellite communications", Dec. 10 2007, retreived from eetimes.com/electronics-news/4162795/L-band-coaxial-resonator-oscillators-deliver-low-phase-noise-for-satellite-communications.*

Yoo, Kyung-Ah, et al. "Reliability study of low cost alternative Ag bonding wire with various bond pad materials." Electronics Packaging Technology Conference, 2009. EPTC'09. 11th. IEEE, 2009.*

Heraeus, "Bonding Wires for Semiconductor Technology", Apr. 2009.*

Temex, "Ceramic Coaxial Resonators", retrieved via archive.org on Jun. 30, 2007.*

Greig, Chapter 8: Chips & Wire Assembly, Integrated Circuit Packaging, Assembly and Interconnections, http://www.globalspec.com/reference, viewed Jun. 22, 2011.

MITEQ Search Results for Oscillators, http://www.miteq.com/results.php, viewed Jun. 22, 2011.

High-Value Phase-Locked Coaxial Resonator, MITEQ, WN-177671B, http://www.miteq.com, Aug. 21, 2007.

High-Performance SAW / STW Oscillators, TriQuint Semiconductor, http://www.triquint.com, 2006.

UK Search and Examination Report, Dated Aug. 29, 2012, UK Intellectual Property Office, Application No. GB1204844.3, 8 pgs.

* cited by examiner

RESONATOR DEVICE

STATEMENT OF GOVERNMENT RIGHTS

The disclosure was made with Government support. The Government has certain rights in this disclosure.

FIELD OF THE DISCLOSURE

The present disclosure is generally related to a resonator device.

BACKGROUND

A resonator device to produce a high frequency, low noise signal may be produced using a crystal oscillator. To manufacture a resonator device using a crystal oscillator, an operating frequency and other circuit design features may be selected. A crystal to be used for the crystal oscillator may be specified and produced based on the operating frequency and the other circuit design features. An oscillation frequency of the crystal may be related to physical characteristics and dimensions of the crystal. Accordingly, the crystal may be custom grown and etched. The crystal growth and etching process can be expensive and time consuming. Additionally, the crystal may be relatively fragile. For example, the crystal may be damaged by impact or shock. Accordingly, crystal oscillator resonator devices may not be ideal for certain uses, such as platforms that are designed to endure launch stresses.

SUMMARY

A resonator device, a system including the resonator device and a method of manufacturing the resonator device are disclosed. The resonator device may include a relatively inexpensive resonator, such as a coaxial resonator. The coaxial resonator may be coupled to a chip-and-wire circuit and hermetically sealed within a housing. Accordingly, the resonator device may be manufactured faster and cheaper than a crystal oscillator-based resonator device. Additionally, the resonator device may be more shock resistant, and therefore more suitable for systems that are subject to significant stresses.

In a particular embodiment, a coaxial resonator device includes a substrate that includes a chip-and-wire circuit. A resonator is coupled to the housing or substrate using a conductive epoxy.

In a particular embodiment, a system includes a resonator device that includes a housing and one or more connectors. A resonator may be coupled to the housing a conductive epoxy. A chip-and-wire circuit may connect the resonator to the one or more connectors. At least one subsystem of the system may be coupled to the one or more connectors to receive a signal having a predetermined frequency from the resonator device.

In a particular embodiment, a method includes coupling a resonator to an integrated circuit die. The method may also include coupling the resonator to a housing. The method may further include hermetically sealing the integrated circuit die and the resonator within the housing.

The features, functions, and advantages that have been described can be achieved independently in various embodiments or may be combined in yet other embodiments, further details of which are disclosed with reference to the following description and drawings.

DETAILED DESCRIPTION

An embodiment includes a coaxial resonator oscillator that provides ultra low noise performance across a broad frequency range (e.g., about 300 MHz to about 3 GHz). The coaxial resonator oscillator combines chip-and-wire manufacturing technology and coaxial resonator technology together to endure space environments in a flight qualifiable package. The coaxial resonator oscillator may include a hermetically sealed package (such as a Kovar alloy package) that houses alumina substrates, silver epoxy pre-forms, semiconductor die, metal-insulator-metal (MIM) capacitors, wirebonds, potting materials, and a coaxial resonator. The package may use three radio frequency (RF) coaxial connectors as an interface to couple the coaxial resonator oscillator to other systems. The connectors may utilize a glass bead fired into the package to provide hermeticity.

The coaxial resonator may include a ceramic coated with silver and a soldered lead. Different coaxial resonator materials may be used depending on a desired target frequency. The coaxial resonator may be attached to a housing a conductive pre-form (such as a silver filled epoxy).

Particular embodiments of the disclosed coaxial resonator oscillator provide phase noise performance superior to other space qualified components. Additionally, the coaxial resonator oscillator can be made in a very small package and can endure space environments including launch and 15 year life requirements with little or no degradation in performance. Particular embodiments of the coaxial resonator oscillator are tunable to meet a specific frequency specification. Disclosed manufacturing processes enable manufacturing and tuning of the resonator without exposing open, unpackaged circuit elements to debris that could either short or damage the circuit elements, such as unpackaged semiconductor open die devices, MIM capacitors, and other circuit elements. Additionally, the coaxial resonator oscillator can be manufactured using many off-the-shelf or otherwise readily available components, which can shorten production time and reduce cost relative to using other types of oscillators, such as crystal oscillators or surface acoustic wave (SAW) oscillators.

Figure 1:
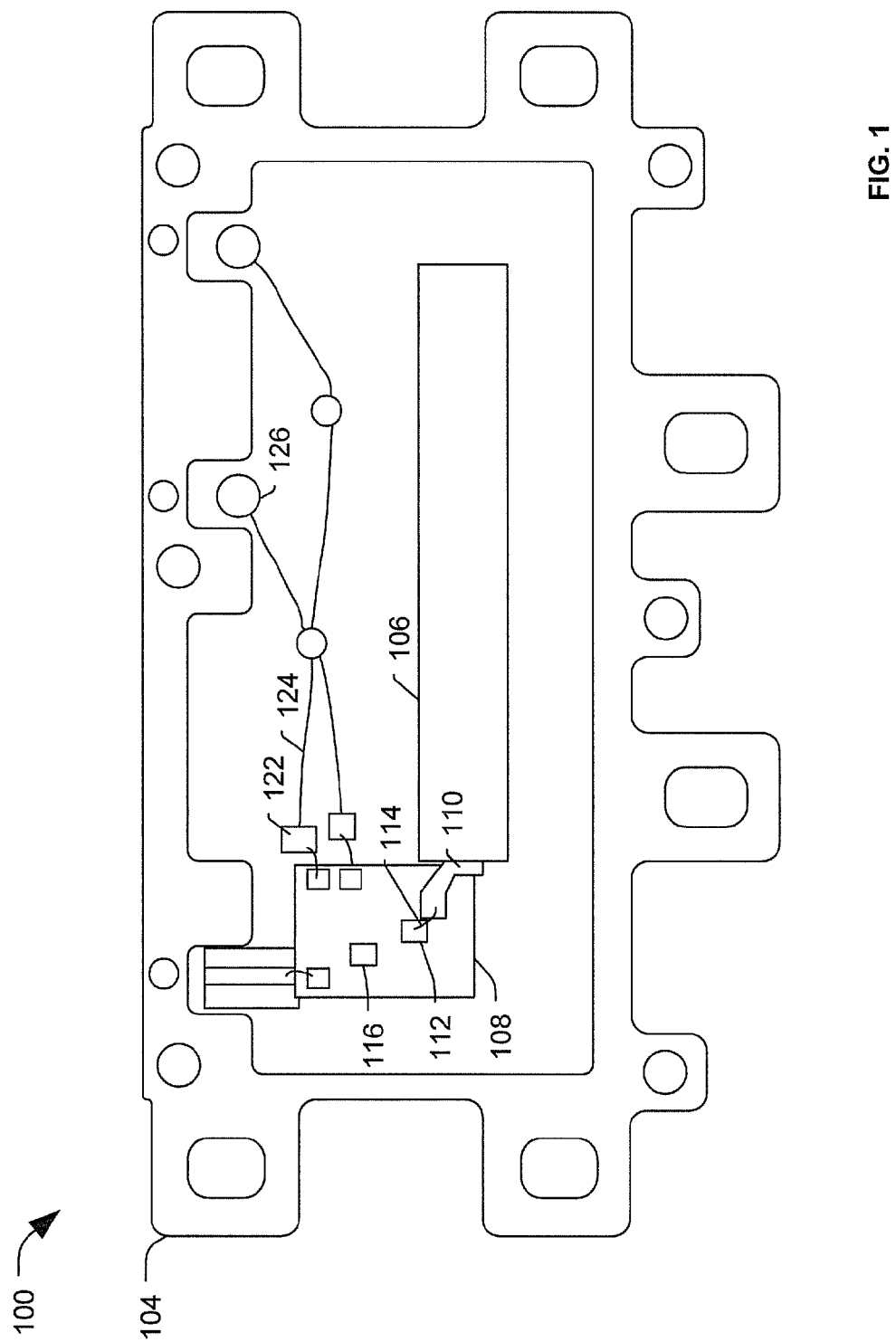
FIG. 1 is a diagram illustrating a particular embodiment of a resonator device.

FIG. 1 is a diagram illustrating a particular embodiment of a resonator device 100, which may be a coaxial resonator oscillator, as described above. The resonator device 100 may include a resonator 106, such as a coaxial resonator. The resonator device 100 may also include a substrate, the housing 104 or another substrate (not shown). In a particular embodiment, the resonator 106 is coupled to the substrate using a conductive epoxy (shown in FIG. 2B), such as a silver epoxy. For example, silver epoxy pre-forms may be used to couple circuit elements, including the resonator 106, to a surface of the housing 104.

The resonator 106 may also be coupled to an integrated circuit assembly 108 as part of a chip-and-wire circuit. A "chip-and-wire circuit" may include an unpackaged die (such as the integrate circuit die 116) coupled to other circuit elements (such as connector pads 122 and connectors 126) using wires 124. For example, in a chip-and-wire circuit, the integrated circuit die 116 may not be packaged within the housing 104. Using bare, unpackaged circuit elements, such as the integrated circuit die 116 may enable the resonator device 100 to be smaller, since the bare circuit elements are smaller than corresponding packaged circuit elements. Additionally, some circuit elements, such as semiconductor devices, may be packaged using materials that are not suitable for space flight. To illustrate, certain semiconductor devices may be packaged in plastics that have a relatively short useful life in space (e.g., less than about 15 years) and that may out-gas or otherwise degrade over time in a manner that can cause problems with the semiconductor devices or with other circuit elements.

In a particular embodiment, the resonator 106 includes or is coupled to an electrical connector, such as a solder-coated connector 110. The solder-coated connector 110 may be coated with a tin/lead based solder. The solder-coated connector 110 may be coupled to a connector pad 112 of the integrated circuit assembly 108 via a conductive element 114.

Certain materials, such as gold, may be relatively unstable in the presence of tin/lead based solder. For certain uses, such as use in space, materials and manufacturing processes may be selected to provide long service life. For example, a typical minimum service life expectation for a satellite may be about 15 years. A connection between a gold conductive element and a tin/lead solder coated element may degrade too quickly for use in such an extended service life system. Silver and tin/lead solder interfaces may last longer. When flux is used to form a silver, tin/lead solder joint, flux that is left over at a silver and tin/lead solder interface can degrade the interface. Accordingly, flux-free connections may be formed between the solder-coated connector 110 and the silver conductive element 114, between the connector pad 112 of the integrated circuit assembly 108 and the silver conductive element 114, or both. For example, a gap welding process may be used to join the silver conductive element 114 to the solder-coated connector 110. The gap welding process may also be used to join the silver conductive element 114 to the connector pad 112. The gap welding process may be performed according to a predetermined welding schedule that specifies conditions to be used, such as a voltage to be used by a welding machine and pressure to be applied to a joint being welded.

In a particular embodiment, the integrated circuit assembly 108 includes a gallium-arsenide and/or a silicon based die. The integrated circuit assembly 108 may be coupled to the substrate using a conductive epoxy, such as a silver epoxy. As described above, the gallium-arsenide and/or silicon based integrated die may be bare (i.e., not packaged).

In a particular embodiment, the resonator 106, the integrated circuit assembly 108, the chip-and-wire circuit or other portions thereof, are at least partially enclosed within the housing 104. For example, the resonator 106 and the chip-and-wire circuit may be hermetically sealed within a cavity formed by the housing 104. In this embodiment, a potting material (not shown in FIG. 1) may at least partially encase the chip-and-wire circuit and the resonator 106. For example, the potting material may directly contact the resonator 106, the integrated circuit assembly 108, the chip-and-wire circuit or other portions of the chip-and-wire circuit, or any combination thereof.

Figure 2A:
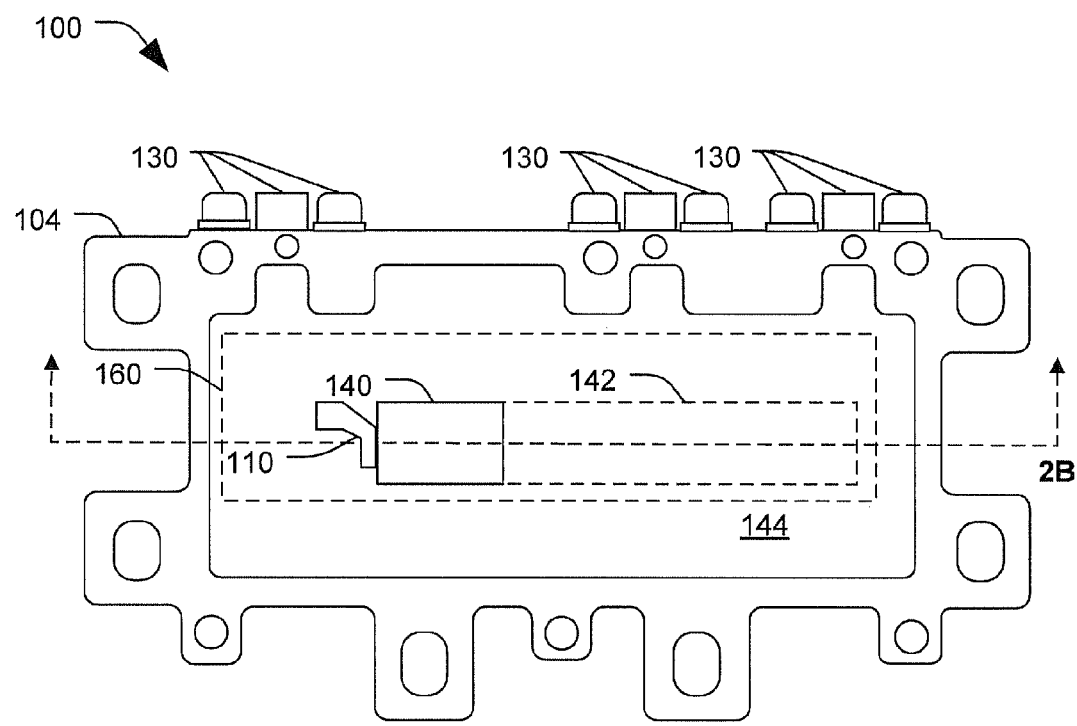
FIGS. 2A and 2B are diagrams illustrating a particular embodiment of a method of manufacturing a resonator device.
Figure 2B:
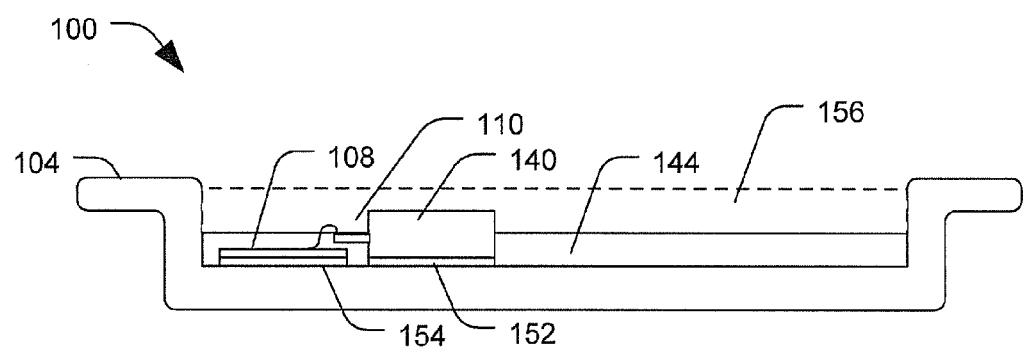

FIGS. 2A and 2B are diagrams illustrating a particular embodiment of a method of manufacturing the resonator device 100. FIG. 2A is a top view of a particular embodiment of a partially complete resonator device 100. FIG. 2B is a sectional view of the partially complete resonator device 100 of FIG. 2A.

In FIG. 2A, a chip-and-wire circuit 160 has been formed within the housing 104. For example, the resonator 106 of FIG. 1 has been coupled to a substrate, such as a surface of the housing 104, using a flux-free process, such as using a conductive epoxy 152. The integrated circuit assembly 108 may also be coupled to the substrate using a flux-free process, such as using a conductive epoxy 154. The resonator 106 of FIG. 1 may be coupled to the integrated circuit assembly 108 via a flux-free process. For example, the solder-coated connector 110 of the resonator 106 of FIG. 1 may be gap welded to the silver conductive element 114 of FIG. 1, which may also be gap welded to the integrated circuit assembly 108. The chip-and-wire circuit 160 may also include connections to other components of the resonator device 100. For example, the chip-and-wire circuit 160 may include conductive elements that connect the integrated circuit assembly 108 to connectors 130 coupled to the housing 104.

After the chip-and-wire circuit 160 is formed, a cavity defined by the housing 104 may be partially filled with a potting material 144. The potting material 144 may substantially cover the integrated circuit assembly 108 and one or more other elements of the chip-and-wire circuit 160. Accordingly, the potting material 144 may protect the elements of the chip-and-wire circuit 160 from contamination. With the elements of the chip-and-wire circuit 160 protected, the resonator 106 of FIG. 1 may be tuned to form a tuned resonator 140. An operating frequency of certain resonators, such as coaxial resonators, may be related to a length of the resonator. Thus, the resonator 106 may be tuned by changing the length of the resonator 106. To illustrate, a portion 142 of the resonator 106 may be removed (e.g., cut away or ground away) leaving the tuned resonator 140.

After the tuned resonator 140 is formed, a remaining portion of the cavity defined by the housing 104 may be filled with additional potting material 156 and the tuned resonator 140 and the chip-and-wire circuit 160 may be hermetically sealed within the housing 104.

Figure 3:
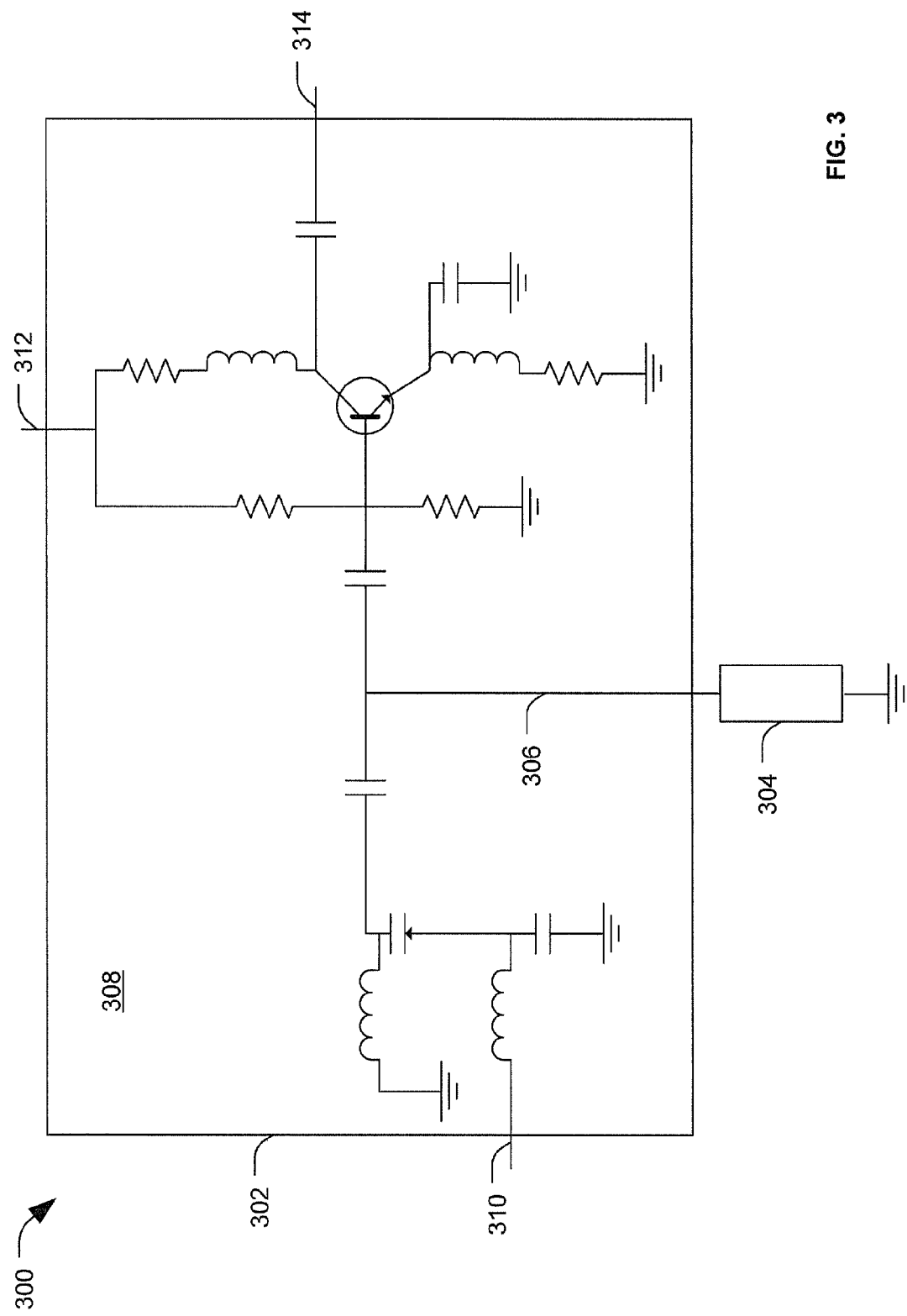
FIG. 3 is a schematic circuit diagram illustrating a particular embodiment of a resonator circuit.

FIG. 3 is a schematic circuit diagram illustrating a particular embodiment of a resonator circuit 300. The resonator circuit 300 may be a chip-and-wire circuit, such as the chip-and-wire circuit 160 of FIG. 2A. For example, the resonator circuit 300 may include an integrated circuit assembly 302 that includes bare (i.e., unpackaged) die. To illustrate, conductors and circuit elements of the integrated circuit assembly 302 may be formed on a substrate 308, such as a ceramic substrate, and may be coupled to a resonator 304 while the conductors and circuit elements are exposed, rather than covered using a polymer or ceramic package. The resonator 304 may be coupled to the integrated circuit assembly 302 via a wire or other conductive element, such as a silver conductive element 306. For example, the silver conductive element 306 may be gap welded, or attached using another flux-free bonding process to, the integrated circuit assembly 302. The silver conductive element 306 may also be coupled to the resonator 304 or to a connector of the resonator 304 using gap welding or another flux-free bonding process.

The integrated circuit assembly 302 may include one or more inputs, such as a first input 310 and a second input 312. The integrated circuit die 302 may also include one or more outputs, such as an output 314. In a particular embodiment, the resonator circuit 300 may generate an output signal having a predetermined frequency at the output 314 in response to a tuning voltage signal received at the first input 310 and in response to power (e.g., a +Vdd input) received at the second input 312. The output signal may be an ultra low phase noise signal. For example, the output signal may include a radio frequency signal with a predetermined frequency between about 300 MHz and about 3 GHz.

Figure 4:
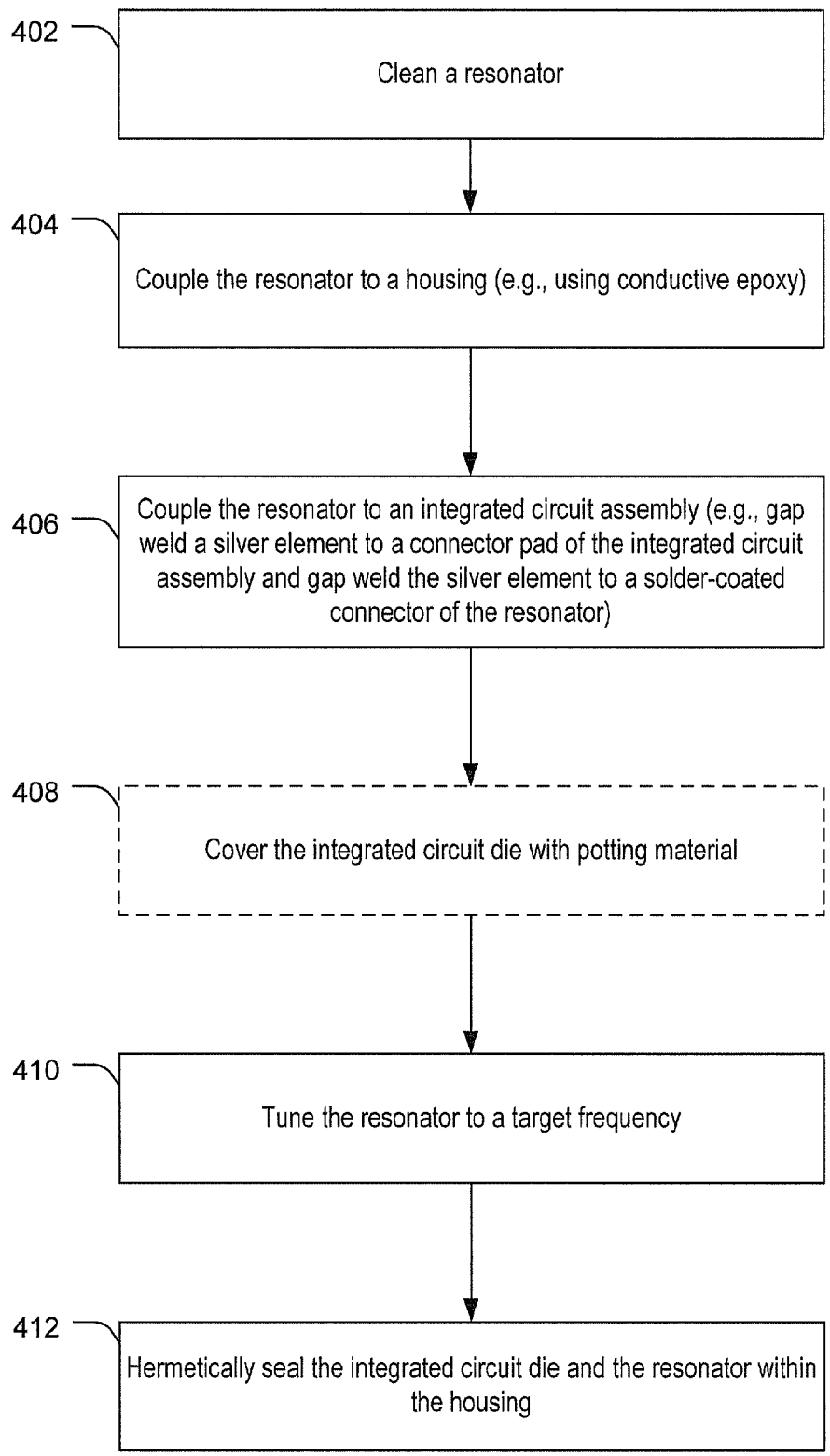
FIG. 4 is flow chart of a particular embodiment of a method of manufacturing a resonator device.

FIG. 4 is flow chart of a particular embodiment of a method of manufacturing a resonator device. For example, the method of FIG. 4 may be used to manufacture the resonator device 100 of FIG. 1. In another example, the method of FIG. 4 may include at least a portion of the method of manufacturing described with reference to FIGS. 2A and 2B.

The method may include, at 402, cleaning a resonator. For example, the resonator may include a coaxial resonator, such as the resonator 106 of FIG. 1 or the resonator 304 of FIG. 3. The resonator may be cleaned to remove flux and other contaminates that may reduce a service life of the resonator device. A "no-clean" flux may be used during manufacture of the coaxial resonator. Cleaning may be performed to remove flux residue. A cleaning process as further described below may remove the flux residue, with an adequately low amount of ionic contaminants remaining after the cleaning process.

For example, Fourier Transform Infrared Spectroscopy and Ion Chromatography were used to tests for ion contamination on sample resonator devices after the sample resonator devices were cleaned using the cleaning process described below. The sample resonator devices had several different configurations (e.g., different lengths of the resonator). TABLES 1-4 show results of the testing.

TABLE 1—showing Ion Chromatography results expresses in ug/in$^2$ (using resonator surface area):

| Sample ID | F$^-$ (ug/in$^2$) | Acetate$^-$ (ug/in$^2$) | Cl$^-$ (ug/in$^2$) | NO$_2^-$ (ug/in$^2$) | Br$^-$ (ug/in$^2$) | NO$_3^-$ (ug/in$^2$) | PO$_4^-$ (ug/in$^2$) | SO$_4^-$ (ug/in$^2$) |
|---|---|---|---|---|---|---|---|---|
| Five short (0.25 in) resonators | <0.01 | 11.16 | 1.82 | <0.01 | 2.46 | 2.59 | <0.01 | 3.50 |
| Three long (1.0 in) resonators | <0.01 | 4.92 | 0.95 | <0.01 | 0.51 | 1.17 | <0.01 | 1.32 |

TABLE 2—showing Ion Chromatography results expresses in ug/in$^2$ (using internal surface area of the housing):

| Sample ID | F$^-$ (ug/in$^2$) | Acetate$^-$ (ug/in$^2$) | Cl$^-$ (ug/in$^2$) | NO$_2^-$ (ug/in$^2$) | Br$^-$ (ug/in$^2$) | NO$_3^-$ (ug/in$^2$) | PO$_4^-$ (ug/in$^2$) | SO$_4^-$ (ug/in$^2$) |
|---|---|---|---|---|---|---|---|---|
| Five short (0.25 in) resonators | <0.01 | 3.28 | 0.53 | <0.01 | 0.72 | 0.76 | <0.01 | 1.03 |
| Three long (1.0 in) resonators | <0.01 | 2.60 | 0.50 | <0.01 | 0.27 | 0.62 | <0.01 | 0.70 |

TABLE 3—showing Ion Chromatography results expresses in ppm (by weight of resonators):

| Sample ID | F$^-$ (ppm) | Acetate$^-$ (ppm) | Cl$^-$ (ppm) | NO$_2^-$ (ppm) | Br$^-$ (ppm) | NO$_3^-$ (ppm) | PO$_4^-$ (ppm) | SO$_4^-$ (ppm) |
|---|---|---|---|---|---|---|---|---|
| Five short (0.25 in) resonators | <0.01 | 5.22 | 0.85 | <0.01 | 1.15 | 1.21 | <0.01 | 1.64 |
| Three long (1.0 in) resonators | <0.01 | 4.92 | 0.95 | <0.01 | 0.51 | 1.17 | <0.01 | 1.32 |

TABLE 4—showing Ion Chromatography results expresses in ppm (by weight of extraction volume):

| Sample ID | F$^-$ (ppm) | Acetate$^-$ (ppm) | Cl$^-$ (ppm) | NO$_2^-$ (ppm) | Br$^-$ (ppm) | NO$_3^-$ (ppm) | PO$_4^-$ (ppm) | SO$_4^-$ (ppm) |
|---|---|---|---|---|---|---|---|---|
| Five short (0.25 in) resonators | <0.01 | 0.86 | 0.14 | <0.01 | 0.19 | 0.20 | <0.01 | 0.27 |
| Three long (1.0 in) resonators | <0.01 | 0.67 | 0.13 | <0.01 | 0.07 | 0.16 | <0.01 | 0.18 |

In an illustrative embodiment, the resonator may be cleaned by exposing the resonator to a flux removing process, including, for example, solvent washing, heating, ultrasonic cleaning, plasma cleaning, or a combination thereof.

The method may also include, at 404, coupling the resonator to a housing, such as the housing 104 of FIGS. 1, 2A and 2B. In a particular embodiment, the resonator is coupled to the housing a flux-free process. For example, the resonator may be coupled to the housing a conductive epoxy, such as silver epoxy pre-forms.

The method may include, at 406, coupling the resonator to an integrated circuit assembly, such as the unpackaged integrated circuit assembly 302 of FIG. 3. For example, the resonator may include or may be coupled to a solder-coated connector, such as the solder-coated connector 110 of FIGS. 1, 2A and 2B. The solder-coated connector may be used to electrically couple the resonator to the integrated circuit assembly. In a particular embodiment, the resonator is coupled to the integrated circuit using a flux-free process. For example, a silver element, such as the silver conductive element 306 of FIG. 3, may be gap welded to a connector pad of the integrated circuit assembly. When the solder-coated connector is used, the silver conductive element may also be gap welded to the solder-coated connector of the resonator.

After the resonator is coupled to the integrated circuit assembly (and possibly after one or more other connections to form a chip-and-wire circuit of the resonator device), the method may include, at 408, covering the integrated circuit assembly with a potting material. For example, as described with reference to FIG. 2B, a cavity formed by the housing may be partially filled to cover the integrated circuit assembly while leaving at least a portion of the resonator exposed. In a particular embodiment, the cavity formed by the housing is not filled with potting material. For example, the housing may be gas filled or filled with another material.

The method may include, at 410, tuning the resonator to a target frequency after coupling the resonator to the integrated circuit die. To illustrate, the resonator may be tuned after the potting material is applied to cover the integrated circuit assembly. In a particular embodiment, an output frequency of the resonator is related to a length of the resonator. In this embodiment, the resonator may be tuned by changing the length of the resonator to cause the output frequency of the resonator to be substantially equal to the target frequency. For example, the length of the resonator may be changed by cutting away or otherwise physically removing a portion of the resonator. The potting material may protect the integrated circuit die and other components of the chip-and-wire circuit from debris generated while tuning the resonator. Additionally, tuning the resonator in this manner enables the resonator to be tuned and tested during operation (i.e., while connected to the integrated circuit assembly and other chip-and-wire circuit elements. Thus, more precise tuning and testing may be performed. After the resonator is tuned, the integrated circuit assembly and the resonator may be hermetically sealed within the housing, at 412.

Thus, the method enables manufacture of a resonator device that is relatively small in size, light weight, and low cost relative to other resonator devices (such as crystal oscillator based devices and SAW oscillator based devices). Additionally, the operating frequency of the resonator can be fine tuned during the manufacturing process.

Figure 5:
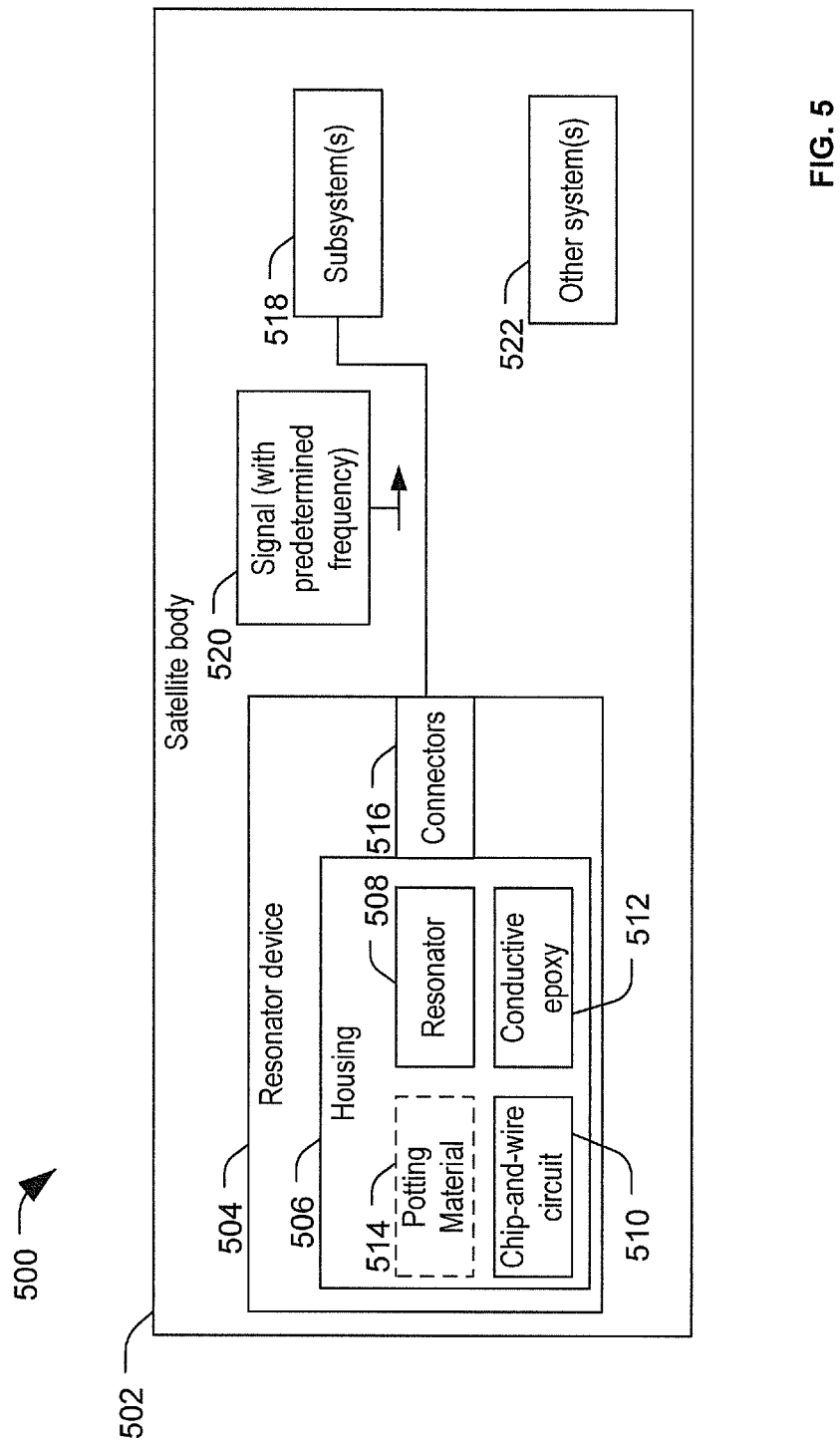
FIG. 5 is a block diagram of a particular embodiment of a system including a resonator device.

FIG. 5 is a block diagram of a particular embodiment of a system 500 including a resonator device 504. In the embodiment illustrated in FIG. 5, the system 500 is a satellite having a satellite body 502 that includes a physical structure to which various subsystems 518 and other systems 522 of the satellite are coupled. In other embodiments, the system 500 may include other systems that use a resonator device, such as the resonator device 504, to generate a signal having a reference frequency. For example, the system 500 may include another type of vehicle, a portable system (e.g., a portable system that is hardened to withstand shock or impact), or a stationary system.

The resonator device 504 may include or be included within the resonator device 100 of FIGS. 1, 2A and 2B. For example, the resonator device 504 may include a resonator 508 coupled to a housing 506 using a flux-free process, such as using a conductive epoxy. The resonator device 504 may also include a chip-and-wire circuit 510 that connects the resonator 508 to the one or more connectors 516 of the housing 506. To illustrate, the chip-and-wire circuit 510 may include an integrated circuit assembly, such as the integrated circuit assembly 108 of FIG. 1, or the integrated circuit assembly 302 of FIG. 3. The integrated circuit assembly may include a bare, unpackaged die.

In a particular embodiment, the integrated circuit assembly, the chip-and-wire circuit 510, the resonator 508, the conductive epoxy 512 or any combination thereof may be at least partially encased within the housing 506 by a potting material 514. For example, the housing 506 may define a cavity. The resonator 508 and the chip-and-wire circuit 510 may be coupled to a surface of the housing 506 using the conductive epoxy 512. The potting material 514 may be applied to substantially fill the cavity defined by the housing 506 and to hermetically seal the resonator 508 and the chip-and-wire circuit 510 within the housing 506. In another particular embodiment, the potting material 514 is not used.

The resonator device 504 may be coupled to one or more subsystems 518 via one or more connectors 516. The resonator device 504 may provide a signal 520 having a predetermined frequency to the one or more subsystems 518. In a particular embodiment, the signal 520 may be an ultra low phase noise radio frequency signal with a predetermined frequency (e.g., a frequency between about 300 MHz and about 3 GHz.

The disclosed resonator device may provide size, weight, cost, and schedule advantages over other resonator devices (such as crystal oscillator based devices and SAW oscillator based devices). The disclosed resonator device may be used to generate a clean tone at a particular frequency. The particular frequency can be tuned by tuning a coaxial resonator during manufacture (e.g., by adjusting the length of the coaxial resonator) or by using a coaxial resonator that is tuned to the particular frequency. Thus, cost, risk of errors and damage, and lead time associated with growing a crystal to generate the particular frequency are eliminated. Additionally, the disclosed resonator device is small, has a relatively long useful life and is not shock sensitive, making the disclosed resonator device particularly useful for space applications or other high reliability requirement extreme environments.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodi-

What is claimed is:

1. A device comprising:
a substrate including a chip-and-wire circuit; and
a coaxial resonator coupled to the substrate using a conductive epoxy,
wherein a cavity formed by the substrate is partially filled with potting material,
wherein the chip-and-wire circuit is covered by the potting material,
wherein at least a portion of the coaxial resonator is not covered by the potting material,
wherein the coaxial resonator has been tuned to a particular operating frequency by removing a portion of the coaxial resonator to reduce a length of the coaxial resonator, and
wherein the coaxial resonator and the chip-and-wire circuit are hermetically sealed within the cavity formed by the substrate after the cavity formed by the substrate is partially filled with the potting material.

2. The device of claim 1, wherein the substrate is a portion of a housing, and wherein the coaxial resonator and the chip-and-wire circuit are at least partially enclosed within the housing.

3. The device of claim 2, wherein the chip-and-wire circuit includes an integrated circuit assembly and wherein the integrated circuit assembly is not packaged within the housing.

4. The device of claim 1, wherein the conductive epoxy includes a silver epoxy.

5. The device of claim 1, wherein the chip-and-wire circuit comprises at least one die in an integrated circuit and wherein the at least one die is gallium-arsenide based or silicon based.

6. The device of claim 5, wherein the at least one die is coupled to the substrate using the conductive epoxy.

7. The device of claim 1, further comprising a solder-coated connector coupling the coaxial resonator to the chip-and-wire circuit.

8. The device of claim 7, further comprising a conductive element connecting the solder-coated connector to the chip-and-wire circuit.

9. The device of claim 8, wherein the conductive element is formed of a material that is stable in contact with the solder-coated connector.

10. The device of claim 8, wherein the solder-coated connector comprises a tin and lead based solder and wherein the conductive element comprises silver.

11. The device of claim 8, wherein the conductive element is gap welded to the solder-coated connector.

12. The device of claim 8, wherein the conductive element is gap welded to the chip-and-wire circuit.

13. A method comprising:
coupling a coaxial resonator to an integrated circuit assembly of a chip-and-wire circuit;
tuning the coaxial resonator to a particular operating frequency by removing a first portion of the coaxial resonator to reduce a length of the coaxial resonator;
coupling the coaxial resonator to a housing;
partially filling the housing with potting material, wherein the chip-and-wire circuit is covered by the potting material and wherein at least a portion of the coaxial resonator is not covered by the potting material; and
hermetically sealing the integrated circuit assembly and the coaxial resonator within the housing after the housing is partially filled with the potting material.

14. The method of claim 13, further comprising cleaning the coaxial resonator before coupling the coaxial resonator to the housing.

15. The method of claim 13, wherein the coaxial resonator is tuned after the housing is partially filled with potting material.

16. The method of claim 13, wherein coupling the coaxial resonator to the integrated circuit assembly comprises:
gap welding a silver element to a connector pad of the integrated circuit assembly; and
gap welding the silver element to a solder-coated connector of the coaxial resonator.

17. A system comprising:
a resonator device including:
a housing having one or more connectors;
a coaxial resonator coupled to the housing a conductive epoxy; and
a chip-and-wire circuit connecting the coaxial resonator to the one or more connectors,
wherein the housing is partially filled with potting material,
wherein the chip-and-wire circuit is covered by the potting material,
wherein at least a portion of the coaxial resonator is not covered by the potting material,
wherein the coaxial resonator has been tuned to a particular operating frequency by removing a portion of the coaxial resonator to reduce a length of the coaxial resonator, and
wherein the coaxial resonator and the chip-and-wire circuit are hermetically sealed within the housing after the housing is partially filled with potting material; and
at least one subsystem coupled to the one or more connectors.

18. The system of claim 17, further comprising a satellite body, wherein the resonator device and the at least one subsystem are coupled to the satellite body.

19. The method of claim 13, a second portion of the coaxial resonator is covered by the potting material.

20. The system of claim 17, wherein a second portion of the coaxial resonator is covered by the potting material.

* * * * *